(12) United States Patent
Yu et al.

(10) Patent No.: US 12,009,220 B2
(45) Date of Patent: Jun. 11, 2024

(54) METHOD FOR PROCESSING WORKPIECE, PLASMA PROCESSING APPARATUS AND SEMICONDUCTOR DEVICE

(71) Applicants: Beijing E-Town Semiconductor Technology Co., Ltd., Beijing (CN); Mattson Technology, Inc., Fremont, CA (US)

(72) Inventors: Fei Yu, Wuhan (CN); Mengyang Xin, Wuhan (CN); Junliang Li, Wuhan (CN)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 17/489,162

(22) Filed: Sep. 29, 2021

(65) Prior Publication Data

US 2023/0005752 A1 Jan. 5, 2023

(30) Foreign Application Priority Data

Jun. 30, 2021 (CN) .......................... 202110734424.0

(51) Int. Cl.
*H01L 21/311* (2006.01)
*H01J 37/32* (2006.01)

(52) U.S. Cl.
CPC ...... *H01L 21/31116* (2013.01); *H01J 37/321* (2013.01); *H01J 37/3244* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| 6,281,132 | B1 | 8/2001 | Nguyen et al. |
| 6,617,244 | B2 | 9/2003 | Nishizawa |
| 7,393,788 | B2 | 7/2008 | Cook |
| 8,614,151 | B2 | 12/2013 | Benson et al. |
| 8,889,024 | B2 | 11/2014 | Watanabe et al. |
| 10,192,751 | B2 | 1/2019 | Yang et al. |
| 10,727,058 | B2 | 7/2020 | Vidyarthi et al. |
| 11,043,393 | B2 | 6/2021 | Wang et al. |

(Continued)

FOREIGN PATENT DOCUMENTS

CN 101983417 B 4/2013

*Primary Examiner* — Roberts P Culbert
(74) *Attorney, Agent, or Firm* — Dority & Manning, P.A.

(57) ABSTRACT

A method for processing a workpiece, a plasma processing apparatus and a semiconductor device are provided. The method includes placing a workpiece including a spacer layer on a workpiece support in a chamber; selecting a composition modulation gas to modulate a volume ratio of carbon and fluorine to process the workpiece, the composition modulation gas includes one or more molecules, the volume ratio of carbon and fluorine is indicative of a distribution of carbon-based polymer deposited on the spacer layer; generating one or more species using one or more plasmas from a process gas to create a mixture, the process gas includes an etching gas and the composition modulation gas; and exposing the workpiece to the mixture to form a polymer layer on at least a portion of the spacer layer and to etch at least a portion of the spacer layer.

7 Claims, 2 Drawing Sheets

(56) References Cited

U.S. PATENT DOCUMENTS

| | | |
|---|---|---|
| 2004/0014305 A1 | 1/2004 | Haselden et al. |
| 2017/0243754 A1* | 8/2017 | Tavernier .......... H01L 29/66795 |
| 2020/0020317 A1 | 1/2020 | Williams et al. |
| 2020/0203182 A1 | 6/2020 | Yan et al. |
| 2021/0005456 A1 | 1/2021 | Sung et al. |
| 2021/0020445 A1 | 1/2021 | Wang et al. |
| 2021/0066047 A1 | 3/2021 | Sung et al. |

* cited by examiner

METHOD FOR PROCESSING WORKPIECE, PLASMA PROCESSING APPARATUS AND SEMICONDUCTOR DEVICE

PRIORITY CLAIM

The present application claims the benefit of priority of China Patent Application No. 202110734424.0, filed on Jun. 30, 2021, which is incorporated herein by reference.

TECHNICAL FIELD

The present disclosure relates to the technical field of semiconductor manufacturing, and in particular to a method for processing a workpiece, a plasma processing apparatus, and a semiconductor device.

BACKGROUND

In the etching process of the semiconductor device manufacturing process, etching gas is often used.

SUMMARY

Aspects and advantages of the disclosure will be set forth in part in the following description, or may be obvious from the description, or may be learned through practice of the embodiments. The present disclosure provides a method for processing a workpiece, a plasma processing apparatus, and a semiconductor device.

According to an aspect of the present disclosure, a method for processing a workpiece is provided. The method includes placing the workpiece on a workpiece support in a chamber. The workpiece comprises a spacer layer. The method includes selecting a composition modulation gas to modulate a volume ratio of carbon and fluorine to process the workpiece. The composition modulation gas comprises one or more molecules having a chemical formula $C_xH_yF_z$, where x and z are natural numbers greater than zero, and y is a natural number greater than or equal to zero, the volume ratio of carbon and fluorine is indicative of a distribution of carbon-based polymer deposited on the spacer layer. The method includes generating one or more species using one or more plasmas from a process gas to create a mixture. The process gas comprises an etching gas and the composition modulation gas. The method further includes exposing the workpiece to the mixture to form a polymer layer on at least a portion of the spacer layer and to etch at least a portion of the spacer layer of the workpiece.

In a specific example of the present disclosure, a first portion of the polymer layer is formed on a first region of the spacer layer, and a second portion of the polymer layer is formed on a second region of the spacer layer, the first region is higher than the second region, and a first thickness of the first portion is different from a second thickness of the second portion.

In a specific example of the present disclosure, the selecting the composition modulation gas to modulate a volume ratio of carbon and fluorine includes one of the following: selecting the composition modulation gas to produce a first volume ratio of carbon and fluorine that is greater than or equal to a preset ratio, such that the first thickness is greater than the second thickness; or selecting the composition modulation gas to produce a second volume ratio of carbon and fluorine that is less than the preset ratio, such that the first thickness is less than the second thickness.

In a specific example of the present disclosure, the spacer layer is an oxide spacer layer.

In a specific example of the present disclosure, the etching gas includes Octafluorocyclobutane ($C_4F_8$).

In a specific example of the present disclosure, the composition modulation gas having a chemical formula $C_xH_yF_z$ includes one or more of Difluoromethane $CH_2F_2$, Fluoroform $CHF_3$, and Carbon tetrafluoride $CF_4$.

In a specific example of the present disclosure, the process gas further includes an inert gas; or, the process gas further includes an inert gas and oxygen.

In a specific example of the present disclosure, a volume proportion of each component in the process gas is as follows: the etching gas: about 10%-about 30%;

The composition modulation gas: about 5%-about 25%; the oxygen: about 3%-about 10%; and the inert gas: about 50%-about 80%.

In a specific example of the present application, a processing parameter of the chamber includes one or more of: a pressure: about 5 mTorr-about 70 mTorr; a source power: about 100 watts-about 500 watts; a center power: about 50 watts-about 200 watts; and a bias power: about 100 watts-about 500 watts.

In a specific example of the present disclosure, the generating the one or more species further includes: providing a first radio frequency (RF) power to an induction coil to generate a first plasma from the process gas to generate a first mixture in the chamber, the first mixture including one or more first species; and providing a second RF power to a bias electrode to generate a second plasma in the first mixture in the chamber to generate a second mixture, the second mixture including one or more second species, exposing the workpiece to the mixture includes exposing the workpiece to the second mixture.

According to another aspect of the present disclosure, a plasma processing apparatus is provided. The plasma processing apparatus includes a plasma chamber having an interior operable to receive a process gas. The plasma processing apparatus includes a processing chamber having a workpiece support operable to support a workpiece. The workpiece includes a spacer layer. The bias electrode is disposed in the workpiece support. The plasma processing apparatus includes a gas delivery system operable to flow a composition modulation gas. The composition modulation gas modulates a volume ratio of carbon and fluorine to process the workpiece. The composition modulation gas includes one or more molecules having a chemical formula $C_xH_yF_z$, where x and z are natural numbers greater than zero, and y is a natural number greater than or equal to zero. The volume ratio of carbon and fluorine is indicative of a distribution of carbon-based polymer deposited on the spacer layer. The plasma processing apparatus includes an inductive element operable to induce a plasma in the plasma chamber. The plasma processing apparatus includes a bias source configured to provide DC power and RF power to the bias electrode. The plasma processing apparatus includes a controller configured to control the gas delivery system, the inductive element, and the bias source to implement an etching process. The etching process includes operations. The operations include admitting the composition modulation gas in the plasma chamber. The operations include admitting an etching gas in the plasma chamber. The operations include providing RF power to the inductive element to generate a first plasma from the process gas to generate a first mixture. The first mixture includes one or more first species. The process gas includes the composition modulation gas and the etching gas. The operations further include providing RF power to the bias electrode to generate a second plasma in the first mixture in the processing chamber to generate a second mixture. The second mixture includes one or more second species.

In a specific example of the present disclosure, a first portion of the polymer layer is formed on a first region of the spacer layer, and a second portion of the polymer layer is formed on a second region of the spacer layer. The first region is higher than the second region, and a first thickness of the first portion is different from a second thickness of the second portion.

In a specific example of the present disclosure, the admitted composition modulation gas produces a first volume ratio of carbon and fluorine that is greater than or equal to a preset ratio, such that the first thickness is greater than the second thickness; or the admitted composition modulation gas produces a second volume ratio of carbon and fluorine that is less than the first preset ratio, such that the first thickness is less than the second thickness.

In a specific example of the present disclosure, the spacer layer is an oxide spacer layer.

In a specific example of the present disclosure, the etching gas includes Octafluorocyclobutane ($C_4F_8$).

In a specific example of the present disclosure, the composition modulation gas includes one or more of Difluoromethane ($CH_2F_2$), Fluoroform ($CHF_3$), and Carbon tetrafluoride ($CF_4$).

In a specific example of the present disclosure, the process gas further includes an inert gas; or, the process gas further includes an inert gas and oxygen.

In a specific example of the present disclosure, a volume proportion of each component in the process gas is as follows: the etching gas: about 10%-about 30%; the composition modulation gas: about 5%-about 25%; the oxygen: about 3%-about 10%; and the inert gas: about 50%-about 80%.

In a specific example of the present disclosure, the plasma chamber and the processing chamber are the same chamber.

In a specific example of the present disclosure, a processing parameter of the chamber includes one or more of: a pressure: about 5 mTorr-about 70 mTorr; a source power: about 100 watts-about 500 watts; a center power: about 50 watts-about 200 watts; and a bias power: about 100 watts-about 500 watts.

According to another aspect of the present disclosure, a semiconductor device including a workpiece processed by a method as described above is provided. The workpiece includes a substrate and the spacer layer formed on the substrate, a height of the substrate etched away in the workpiece obtained is in a range of about 2 nanometers (nm) to about 4 nm.

According to the technology of the present disclosure, the composition modulation gas is added to the etching gas, so that the composition modulation gas is used to modulate the volume ratio of carbon and fluorine, thereby modulating the etching conditions of different positions of a same film layer, to minimize the time of over-etching, to minimize the loss caused by over-etching of the underlying substrate, and to increase the yield and finished product ratio.

These and other features, aspects and advantages of the present disclosure will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Figure 1:
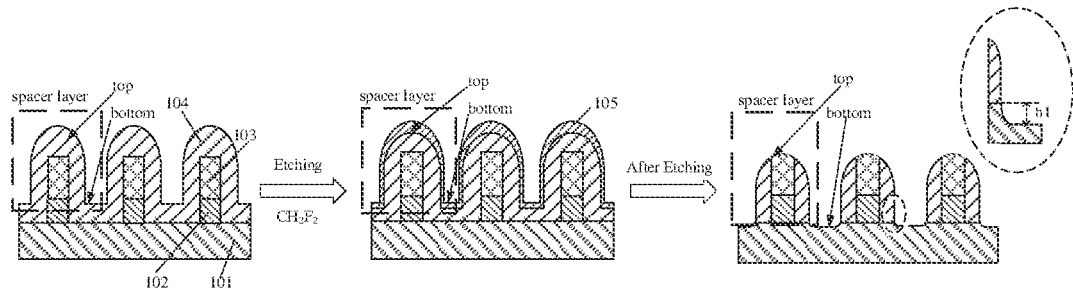
FIG. 1 is a first schematic diagram of a processing flow in a specific example of a method for processing a workpiece according to an embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the etching process of the semiconductor device manufacturing process, there is a problem of nonuniformity in the etching rate at different positions of the workpiece, which may lead to the problem that different positions of a same film layer cannot be etched out at the same time. In order to realize that different positions of a same film layer are opened at the same time, the work will inevitably lead to long-term over-etching on certain positions, for example, the substrate portion that does not need to be etched too much is lost too much, which reduces the yield and finished product ratio.

For example, in the plasma etching of the silicon oxide spacer layer, due to the different etching rates at the top and bottom of the silicon oxide spacer layer, the silicon oxide on the top and the bottom of the silicon oxide spacer layer cannot be opened at the same time. Therefore, if both the top and the bottom are opened, it will inevitably cause long-term over-etching in some areas, for example, resulting in excessive loss of the silicon substrate, which reduces the yield and finished product ratio.

In order to solve the above problems, the present disclosure provides a plasma etching process for the spacer layer, which open the top and bottom of the spacer layer while minimizing over-etching time and reducing substrate loss, and improves the yield and finished product ratio.

In the present disclosure, a spacer layer is formed on the workpiece; for example, in a specific example, the workpiece includes at least a substrate and a stack structure formed on the substrate, and the stack structure includes at least at an oxide layer which forms an oxide spacer layer on the substrate.

In a specific example, before the etching process, as shown in FIG. 1, the substrate 101 is a silicon substrate, and the stacked structure includes, from bottom to top, a gate layer 102 formed on at least a portion of the substrate, a silicon nitride layer 103 formed on the gate layer 102, and a silicon oxide layer 104, the silicon oxide layer 104 is formed on the silicon nitride layer 103 and on other regions of the substrate 101 where the gate layer 102 and the silicon nitride layer 103 are not formed, so as to form a silicon oxide spacer layer.

In a specific example, the composition modulation gas is selected in the etching process to modulate the volume ratio of carbon to fluorine, so as to control the distribution of the carbon-based polymer formed on the spacer layer based on the volume ratio of carbon to fluorine. Here, the composition modulation gas contains one or more molecules having a chemical formula $C_xH_yF_z$, where x and z are natural numbers greater than zero, and may be the same or different natural numbers and y is a natural number greater than or equal to zero. Then, one or more species were generated using one or more plasmas from a process gas including the composition modulation gas to create a mixture. Here, the process gas further includes an etching gas and the modulating the volume ratio of carbon and fluorine may specifically be modulating the volume ratio of carbon and fluorine in the process gas. Further, when workpiece is exposed to the mixture, part of the substances in the mixture react with the oxide layer to form a polymer layer which covers the oxide layer, and at the same time, part of the gas in the process gas etches at least a portion of the spacer layer.

In a specific example, the etching gas is $C_4F_8$. In another specific example, the composition modulation gas includes one or more of Difluoromethane($CH_2F_2$), Fluoroform ($CHF_3$), and Carbon tetrafluoride ($CF_4$).

Here, the volume ratio of carbon to fluorine may also be the ratio of the number of atoms.

It should be noted that the polymer layer formed on the oxide layer includes a carbon-based polymer. Of course, in practical applications, the polymer layer may also include other polymers, and is not restricted specifically in the disclosure.

In addition, in practical applications, the step of forming the polymer layer and the etching step occur at the same time, but the etching rate is greater than the formation rate of the polymer layer. In this way, the etching is implemented so as to expose the film layer that needs to be exposed. For example, for the oxide spacer layer, after etching, the top of the oxide spacer layer exposes a portion of the silicon nitride layer, and the bottom of the oxide spacer layer exposes a portion of the substrate.

In a specific example, the first portion of the polymer layer is formed on the first area (for example, the top) of the spacer layer, and the second portion of the polymer layer is formed on the second area (for example, the bottom) of the spacer layer. The first area may be higher than the second area, and the first thickness of the first portion may be different from the second thickness of the second portion, that is to say, the thickness of the polymer layer formed on the top of the spacer layer is different from the thickness of the polymer layer formed on the bottom of the oxide spacer layer. In this way, it is convenient for the composition modulation gas to control the distribution of the polymer layers formed on the top and bottom of the silicon oxide spacer layer, indirectly adjust the etching rate, and realize the simultaneous opening of the top and bottom silicon oxide layers in the spacer layer, reduce over-etching time and avoid excessive loss of substrate.

In a specific example, selecting the composition modulation gas may specifically include: selecting the composition modulation gas to produce a first volume ratio of carbon and fluorine that is greater than or equal to a preset ratio, such that the first thickness is greater than the second thickness. For example, a composition modulation gas is selected such that the volume ratio of carbon and fluorine in the process gas is greater than or equal to a preset ratio. Here, in an example, after the etching gas is determined, modulating the volume ratio of carbon and fluorine in the process gas may be specifically modulating the volume ratio of carbon and fluorine in the composition modulation gas, needed to be used, to be greater than or equal to the volume ratio of carbon and fluorine in the etching gas. For example, the volume ratio of carbon and fluorine in the etching gas is 0.5, and the volume ratio of carbon and fluorine in the composition modulation gas may be modulated to be greater than or equal to 0.5, so that the thickness of the polymer layer formed on the top of the spacer layer (that is, the first thickness) is greater than the thickness of the polymer layer on the bottom (that is, the second thickness). In other words, when the volume ratio of carbon and fluorine in the process gas is greater than or equal to the preset ratio, the growth rate of the polymer layer on the top of the spacer layer is greater than the growth rate on the bottom, so that the thickness of the top polymer layer of the spacer layer is greater than the thickness of the bottom polymer layer.

For example, as shown in FIG. 1, the etching gas is $C_4F_8$, and, Difluoromethane ($CH_2F_2$) is selected as the composition modulation gas. In this case, during the etching process, the thickness of the polymer layer 105 formed on the top of the silicon oxide spacer layer is greater than the thickness of the polymer layer 105 formed on the bottom. In this case, part of the gas in the process gas, such as $C_4F_8$ and $CH_2F_2$, etches the polymer layer formed, etches the oxide layer on the top and bottom of the silicon oxide spacer layer, but does not etch the silicon oxide layer of the spacer layer, so that the silicon oxide layers on the top and bottom of the silicon oxide spacer layer are opened at the same time to obtain an etched structure. In the etched structure, the top of the silicon oxide spacer layer exposes a portion of the silicon nitride layer, and the bottom exposes a portion of the substrate (such as a silicon substrate). In this case, the height of the substrate etched away is h1, which meets the etching requirements.

In another specific example, selecting the composition modulation gas may specifically include: selecting the composition modulation gas to produce a second volume ratio of carbon and fluorine that is less than the preset ratio, such that the first thickness is less than the second thickness. For example, a composition modulation gas is selected such that the volume ratio of carbon and fluorine in the process gas is less than the preset ratio. Here, in an example, after the etching gas is determined, modulating the volume ratio of carbon and fluorine in the process gas may be specifically modulating the volume ratio of carbon and fluorine in the composition modulation gas, needed to be used, to be less than the volume ratio of carbon and fluorine in the etching gas. For example, the volume ratio of carbon and fluorine in the etching gas is 0.5, and the volume ratio of carbon and fluorine in the composition modulation gas may be modulated to be less than 0.5, so that the thickness of the polymer layer formed on the top of the spacer layer (that is, the first thickness) is less than the thickness of the polymer layer on the bottom (that is, the second thickness). In other words, when the volume ratio of carbon and fluorine in the process gas is less than the preset ratio, the growth rate of the polymer layer on the top of the spacer layer is less than the growth rate on the bottom, so that the thickness of the top polymer layer of the spacer layer is less than the thickness of the bottom polymer layer.

It should be noted that the numerical values given in the above-mentioned preset ratios are only exemplary and not restricted to 0.5. In actual applications, the preset ratio may be modulated based on actual etching requirements to meet different etching requirements.

Figure 2:
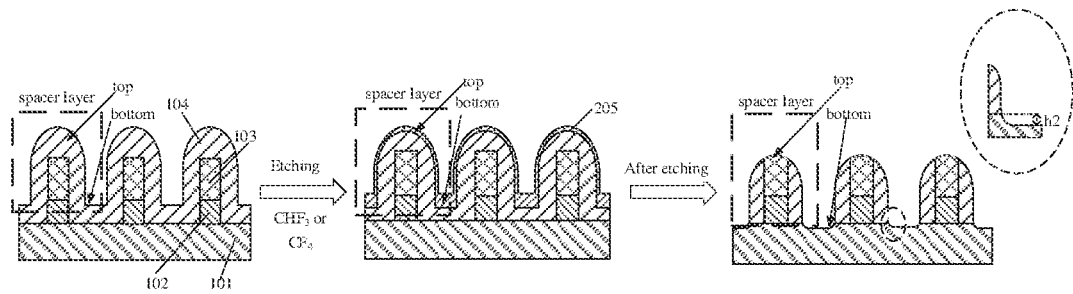
FIG. 2 is a second schematic diagram of a processing flow in a specific example of a method for processing a workpiece according to an embodiment of the present disclosure.

For example, as shown in FIG. 2, the etching gas is $C_4F_8$, and Trifluoromethane ($CHF_3$), or Carbon tetrafluoride ($CF_4$) or a mixture thereof is selected as the composition modulation gas. In this case, the thickness of the polymer layer 205 formed on the top of the silicon oxide spacer layer is less the thickness of the polymer layer 205 formed on the bottom. In this case, part of the gas in the process gas etches the polymer layer formed, etches the silicon oxide layer on the top and bottom of the oxide spacer layer, but does not etch the silicon oxide layer of the spacer layer, so that the oxide layers on the top and bottom of the silicon oxide spacer layer are opened at the same time to obtain an etched structure. In the etched structure, the top of the oxide spacer layer exposes a portion of the silicon nitride layer, and the bottom exposes a portion of the substrate (such as a silicon substrate). In this case, the height of the substrate etched away is h2, which meets the etching requirements.

Figure 3:
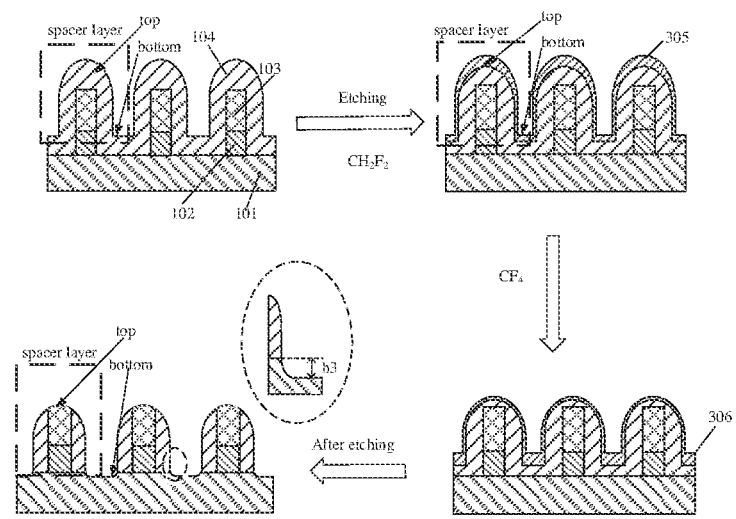
FIG. 3 is a third schematic diagram of a processing flow in a specific example of a method for processing a workpiece according to an embodiment of the present disclosure.

In a specific example, the composition modulation gas may also be modulated or changed during the etching process to control the distribution of the carbon-based polymer formed on the oxide spacer layer. For example, as shown in FIG. 3, the etching gas is $C_4F_8$, and first, Difluoromethane ($CH_2F_2$) is selected as the composition modulation gas. At this time, during the etching process, the thickness of the polymer layer 305 formed on the top of the silicon oxide spacer layer is greater than the thickness of the polymer layer 305 formed on the bottom. If it is expected to change the distribution of the polymer layer, the composition adjustment gas can be selected again to modulate the volume ratio of carbon to fluorine in the process gas. For example, during the etching process, Carbon tetrafluoride ($CF_4$) may be selected to modulate the distribution of the polymer layer again, so that the thickness of the polymer layer 306 formed on the top of the silicon oxide spacer layer is less than the thickness of the polymer layer 306 formed on the bottom. In this process, the height of the substrate etched away is h3, which meets the etching requirements.

It should be noted that, in practical applications, the composition modulation gas and the etching gas may be mixed first, and then injected into the chamber; alternatively, they may be injected into the chamber sequentially, and the order of injecting is not restricted.

In practical applications, modulating the composition modulation gas in the etching process may be implemented using the following two methods:

Method 1: the first selected composition modulation gas, such as Difluoromethane ($CH_2F_2$), is extracted from the chamber, that is, the chamber is evacuated, and then the etching gas and the second selected composition modulation gas (such as Carbon tetrafluoride ($CF_4$)) are injected into the chamber.

Method 2: in the presence of the first selected composition modulation gas, such as Difluoromethane ($CH_2F_2$), in the chamber, the second selected composition modulation gas (such as Carbon tetrafluoride ($CF_4$)) is inject directly.

The above-mentioned method 1 and method 2 may be selected as needed, and is not restricted in the present disclosure.

It should be noted that the heights of the substrates etched away by the methods shown in FIG. 1 to FIG. 3, such as h1, h2, and h3, are different, so as to meet the different needs of users. Further, in a specific example, the height of the substrate etched away after the etching process of the present disclosure is between about 2 nanometers and about 4 nanometers, for example, as shown in FIG. 1 or 2 or 3, the height is between about 2 nanometers and about 4 nanometers, for example, about 2 nanometers, or about 3 nanometers, or about 3.2 nanometers, or about 4 nanometers, etc. Thus, compared with the prior art, the present disclosure reduces the height of over-etching, improves the degree of refinement, and lays a foundation for achieving miniaturization.

In this way, by modulating the volume ratio of carbon and fluorine in the etching gas, the growth rate of the polymer layer on the top and bottom of the spacer layer can be modulated, and the etching rate of the top and bottom of the spacer layer can be modulated indirectly, to optimize the time difference between opening the top and bottom of the oxide spacer layer.

In a specific example, the composition modulation gas may not contain hydrogen. In this case, y in the general chemical formula $C_xH_yF_z$ is equal to 0. Alternatively, in another specific example, the composition modulation gas contains hydrogen element. In this case, y in the general chemical formula CxHyFz is not equal to zero.

In a specific example, the process gas also contains an inert gas, such as argon (Ar), to enhance the ion bombardment capability during the etching process. Alternatively, in another specific example, the process gas contains not only an inert gas, such as argon (Ar), but also oxygen. Here, oxygen can control the etching selection ratio between the oxide and the substrate, such as a silicon substrate.

In a specific example, the volume ratio of each component in the process gas is as follows:

the etching gas: about 10% to about 30%, for example, in some examples, the etching gas accounts for about 10%, or about 30%, or about 15%, or about 20%, etc, and the specific proportion is not restricted specifically in the present disclosure;

the composition modulation gas: about 5% to about 25%, for example, in some examples, the composition modulation gas accounts for about 5%, or about 25%, or about 15%, or about 20%, etc., and the specific proportion is not restricted specifically in the present disclosure;

the oxygen: about 3%-about 10%, for example, in some examples, oxygen accounts for about 3%, or about 10%, or about 5%, or about 7%, etc., and the specific proportion is not restricted specifically in the present disclosure;

the inert gas: about 50%-about 80%, for example, in some examples, the inert gas accounts for about 50%, or about 80%, or about 60%, or about 70%, etc., and the specific proportion is not restricted specifically in the present disclosure.

Here, it should be noted that the workpiece described in the present disclosure may specifically be a semiconductor device or other devices. Specifically, in an example, the workpiece described in the present disclosure is a semiconductor device.

It should be noted that in the present disclosure, the use of the term "about" in combination with a numerical value is intended to be within ten percent (10%) of the indicated value.

In this way, in the present disclosure, a composition adjustment gas is added to the process gas, and used to modulate the etching conditions of different positions of a same film layer, thereby minimizing the over-etching time and minimizing the loss caused by the over-etching of the underlying substrate, thereby increasing the yield and finished product ratio.

Figure 4:
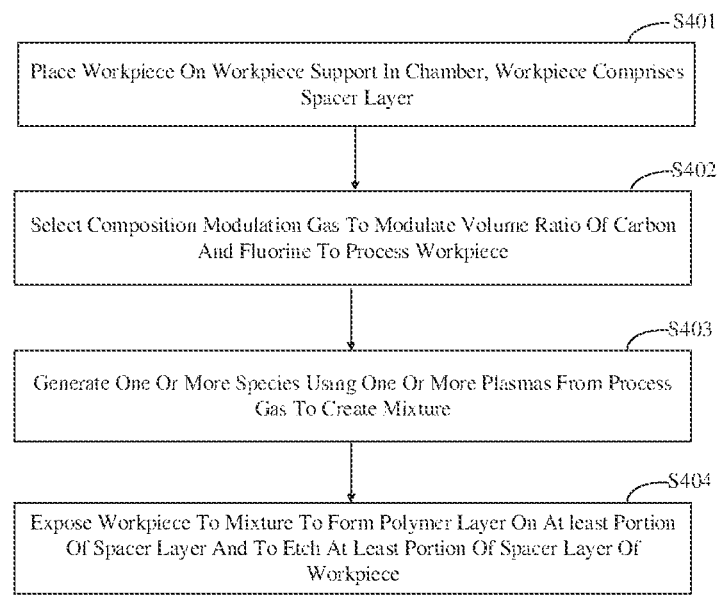
FIG. 4 a schematic diagram of the implementation process of the method for processing a workpiece according to an embodiment of the present disclosure.

The present disclosure also provides a method for processing a workpiece, as shown in FIG. 4, including the following steps:

Step S401: placing the workpiece on a workpiece support in a chamber. The workpiece includes a spacer layer.

In a specific example, the workpiece includes at least a substrate and a stack structure formed on the substrate, and the stack structure includes at least at an oxide layer which forms an oxide spacer layer on the substrate. For example, before the etching process, as shown in FIG. 1, the substrate 101 is a silicon substrate, and the stacked structure includes, from bottom to top, a gate layer 102 formed on at least a portion of the substrate, a silicon nitride layer 103 formed on the gate layer 102, and a silicon oxide layer 104, the silicon oxide layer 104 is formed on the silicon nitride layer 103 and on other regions of the substrate 101 where the gate layer 102 and the silicon nitride layer 103 are not formed, so as to form a silicon oxide spacer layer.

In a specific example, the spacer layer is an oxide spacer layer.

It should be noted that the chamber may be specifically a processing chamber, or a chamber functioning as a processing chamber and a plasma chamber. That is to say, in practical applications, the present disclosure is applicable to a plasma processing apparatus including separated processing chamber and plasma chamber, and in this case, the workpiece support is put in the processing chamber. Similarly, the present disclosure is applicable to a plasma processing apparatus in which the plasma chamber and the processing chamber is the same chamber.

In addition, it should be noted that the workpiece described in the present disclosure may specifically be a semiconductor device or other devices. Specifically, in an example, the workpiece described in the present disclosure is a semiconductor device.

Step S402: selecting a composition modulation gas to modulate a volume ratio of carbon and fluorine to process the workpiece. The composition modulation gas includes one or more molecules having a chemical formula $C_xH_yF_z$, where x and z are natural numbers greater than zero, and y is a natural number greater than or equal to zero. The volume ratio of carbon and fluorine is indicative of a distribution of carbon-based polymer deposited on the spacer layer In a specific example, by selecting different composition modulation gases, the resulting substrates are etched to different heights. For example, the heights of the substrates etched away by the methods shown in FIG. 1 to FIG. 3, such as h1, h2, and h3, are different, so as to meet the different needs of users.

In a specific example, the height of the substrate etched away after the etching process of the present disclosure is between about 2 nanometers and about 4 nanometers, for example, as shown in FIG. 1 or 2 or 3, the height is between about 2 nanometers and about 4 nanometers, for example, about 2 nanometers, or about 3 nanometers, or about 3.2 nanometers, or about 4 nanometers, etc. Thus, compared with the prior art, the present disclosure reduces the height of over-etching, improves the degree of refinement, and lays a foundation for achieving miniaturization.

In another specific example, the target height, that is, the target height at which the substrate needs to be etched away can be predicted, and the composition modulation gas can be selected based on the target height, so that the height at which the substrate is etched after the etching process is matched with the target height. Here, the matching may specifically mean that the error of the two is within a preset error range.

Here, the volume ratio of carbon to fluorine may also be the ratio of the number of atoms.

Step S403: generating one or more species using one or more plasmas from a process gas to create a mixture. The process gas includes an etching gas and the composition modulation gas.

It should be noted that, in practical applications, the composition modulation gas and the etching gas may be mixed first, and then injected into the chamber. Alternatively, they may be injected into the chamber sequentially, and the order of injecting is not restricted. The specific injection method is not specifically restricted in the present disclosure.

Of course, in practical applications, if the present disclosure is implemented on a plasma processing apparatus including separated processing chamber and plasma chamber, the step of generating plasma may be specifically performed in the plasma chamber, and then after obtaining the mixture, the mixture is introduced into the processing chamber to complete the workpiece processing flow.

In a specific example, the etching gas is $C_4F_8$. In another specific example, the composition modulation gas includes at least one of Difluoromethane ($CH_2F_2$), Fluoroform ($CHF_3$), and Carbon tetrafluoride ($CF_4$).

In a specific example, the plasma mixture can be obtained in the following manner. Specifically, the one or more plasmas generated by the process gas are used to generate one or more substances to obtain the mixture, which specifically includes: providing a first radio frequency (RF) power to an induction coil to generate a first plasma from the process gas to generate a first mixture in the chamber, the first mixture including one or more first species; and providing a second RF power to a bias electrode to generate a second plasma in the first mixture in the chamber to generate a second mixture, the second mixture including one or more second species. Here, the bias electrode is provided below the workpiece support, or is provided inside the workpiece support. Based on this, the exposing the workpiece to the mixture specifically includes exposing the workpiece to the second mixture.

That is to say, there are two ways to generate plasma. In the first way, the first plasma is obtained based on the action of the induction coil to obtain the first mixture. In the second way, the second plasma is generated on the basis of the first mixture based on the action of the bias electrode to obtain the second mixture.

It should be noted that if the present disclosure is implemented on a plasma processing apparatus including separated processing chamber and plasma chamber, then the first way described above is implemented in the plasma chamber, and the first mixture is introduced into processing chamber; and the second way is realized in the processing chamber.

Here, it should be noted that on the basis of being able to generate plasma, the bias electrode can also increase the physical bombardment ability, so as to improve the etching efficiency.

Step S404: exposing the workpiece to the mixture to form a polymer layer on at least a portion of the spacer layer and to etch at least a portion of the spacer layer of the workpiece.

It should be noted that the step of forming the polymer layer and the etching step occur at the same time. Based on this, in step 404, the two "at least a portion", that is, the at least a portion of the spacer layer that is etched and the at least a portion of the spacer layer on which the polymer layer is formed may be the same or different, and is not restricted specifically in the present disclosure. In practical applications, the etching rate is greater than the formation rate of the polymer layer, such that the etching is achieved to expose the film layer that needs to be exposed. For example, for the oxide spacer layer, after etching, the top of the oxide spacer layer exposes a portion of the silicon nitride layer, and the bottom of the oxide spacer layer exposes a portion of the substrate.

Further, it should be noted that when the workpiece is exposed to the mixture, part of the substances in the mixture react with the oxide layer to form a polymer layer which covers the oxide layer, and at the same time, part of the gas in the process gas etches at least a portion of the spacer layer. Here, the polymer layer includes a carbon-based polymer. Of course, in practical applications, the polymer layer may also include other polymers, and is not restricted specifically in the present disclosure.

In a specific example, the first portion of the polymer layer is formed on the first area (for example, the top) of the spacer layer, and the second portion of the polymer layer is formed on the second area (for example, the bottom) of the spacer layer. The first area may be higher than the second area, and the first thickness of the first portion may be different from the second thickness of the second portion, that is to say, the thickness of the polymer layer formed on the top of the spacer layer is different from the thickness of the polymer layer formed on the bottom of the oxide spacer layer. In this way, it is convenient for the composition modulation gas to control the distribution of the polymer layers formed on the top and bottom of the silicon oxide spacer layer, indirectly adjust the etching rate, and realize the simultaneous opening of the top and bottom silicon oxide layers in the spacer layer, reduce over-etching time and avoid excessive loss of substrate.

In a specific example, selecting the composition modulation gas may specifically include: selecting the composition modulation gas to produce a first volume ratio of carbon and fluorine that is greater than or equal to a preset ratio, such that the first thickness is greater than the second thickness. For example, a composition modulation gas is selected such that the volume ratio of carbon and fluorine in the process gas is greater than or equal to a preset ratio. Here, in an example, after the etching gas is determined, modulating the volume ratio of carbon and fluorine in the process gas may be specifically modulating the volume ratio of carbon and fluorine in the composition modulation gas required to be greater than or equal to the volume ratio of carbon and fluorine in the etching gas. For example, the volume ratio of carbon and fluorine in the etching gas is 0.5, and the volume ratio of carbon and fluorine in the composition modulation gas may be modulated to be greater than or equal to 0.5, so that the thickness of the polymer layer formed on the top of the spacer layer (that is, the first thickness) is greater than the thickness of the polymer layer on the bottom (that is, the second thickness). In other words, when the volume ratio of carbon and fluorine in the process gas is greater than or equal to the preset ratio, the growth rate of the polymer layer on the top of the spacer layer is greater than the growth rate on the bottom, so that the thickness of the top polymer layer of the spacer layer is greater than the thickness of the bottom polymer layer.

For example, as shown in FIG. 1, the etching gas is $C_4F_8$, and, Difluoromethane ($CH_2F_2$) is selected as the composition modulation gas. In this case, during the etching process, the thickness of the polymer layer 105 formed on the top of the silicon oxide spacer layer is greater than the thickness of the polymer layer 105 formed on the bottom. In this case, part of the gas in the process gas, such as $C_4F_8$ and $CH_2F_2$, etches the polymer layer formed, etches the oxide layer on the top and bottom of the silicon oxide spacer layer, but does not etch the silicon oxide layer of the spacer layer, so that the silicon oxide layers on the top and bottom of the silicon oxide spacer layer are opened at the same time to obtain an etched structure. In the etched structure, the top of the silicon oxide spacer layer exposes a portion of the silicon nitride layer, and the bottom exposes a portion of the substrate (such as a silicon substrate). In this case, the height of the substrate etched away is h1, which meets the etching requirements.

In another specific example, selecting the composition modulation gas may specifically include: selecting the composition modulation gas to produce a second volume ratio of carbon and fluorine that is less than the preset ratio, such that the first thickness is less than the second thickness. For example, a composition modulation gas is selected such that the volume ratio of carbon and fluorine in the process gas is less than the preset ratio. Here, in an example, after the etching gas is determined, modulating the volume ratio of carbon and fluorine in the process gas may be specifically modulating the volume ratio of carbon and fluorine in the composition modulation gas, needed to be used, to be less than the volume ratio of carbon and fluorine in the etching gas. For example, the volume ratio of carbon and fluorine in the etching gas is 0.5, and the volume ratio of carbon and fluorine in the composition modulation gas, needed to be used, may be modulated to be less than 0.5, so that the thickness of the polymer layer formed on the top of the spacer layer (that is, the first thickness) is less than the thickness of the polymer layer on the bottom (that is, the second thickness). In other words, when the volume ratio of carbon and fluorine in the process gas is less than the preset ratio, the growth rate of the polymer layer on the top of the spacer layer is less than the growth rate on the bottom, so that the thickness of the top polymer layer of the spacer layer is less than the thickness of the bottom polymer layer.

It should be noted that the numerical values given in the above-mentioned preset ratios are only exemplary and not restricted to 0.5. In actual applications, the preset ratio may be modulated based on actual etching requirements to meet different etching requirements.

For example, as shown in FIG. 2, the etching gas is $C_4F_8$, and Trifluoromethane ($CHF_3$), or Carbon tetrafluoride ($CF_4$) or a mixture thereof is selected as the composition modulation gas. In this case, the thickness of the polymer layer 205 formed on the top of the silicon oxide spacer layer is less than the thickness of the polymer layer 205 formed on the bottom. In this case, part of the gas in the process gas etches the polymer layer formed, etches the silicon oxide layer on the top and bottom of the silicon oxide spacer layer, but does not etch the silicon oxide layer of the spacer layer, so that the oxide layers on the top and bottom of the silicon oxide spacer layer are opened at the same time to obtain an etched structure. In the etched structure, the top of the oxide spacer layer exposes a portion of the silicon nitride layer, and the bottom exposes a portion of the substrate (such as a silicon substrate). In this case, the height of the substrate etched away is h2, which meets the etching requirements.

In a specific example, the composition modulation gas may also be modulated or changed during the etching process to control the distribution of the carbon-based polymer formed on the oxide spacer layer. For example, as shown in FIG. 3, the etching gas is $C_4F_8$, and first, Difluoromethane ($CH_2F_2$) is selected as the composition modulation gas. At this time, during the etching process, the thickness of the polymer layer 305 formed on the top of the silicon oxide spacer layer is greater than the thickness of the polymer layer 305 formed on the bottom. If it is expected to change the distribution of the polymer layer, the composition modulation gas can be selected again to modulate the volume ratio of carbon to fluorine in the process gas. For example, during the etching process, Carbon tetrafluoride ($CF_4$) may be selected to modulate the distribution of the polymer layer again, so that the thickness of the polymer layer 306 formed on the top of the silicon oxide spacer layer is less than the thickness of the polymer layer 306 formed on the bottom. In this process, the height of the substrate etched away is h3, which meets the etching requirements It should be noted that, in practical applications, the composition modulation gas and the etching gas may be mixed first, and then injected into the chamber; alternatively, they may be injected into the chamber sequentially, and the order of injecting is not restricted.

In practical applications, modulating the composition modulation gas in the etching process may be implemented using the following two methods:

Method 1: the first selected composition modulation gas, such as Difluoromethane ($CH_2F_2$), is extracted from the chamber, that is, the chamber is evacuated, and then the etching gas and the second selected composition modulation gas (such as Carbon tetrafluoride ($CF_4$)) are injected into the chamber.

Method 2: in the presence of the first selected composition modulation gas, such as Difluoromethane ($CH_2F_2$), in the chamber, the second selected composition modulation gas (such as carbon tetrafluoride $CF_4$) is inject directly.

The above-mentioned method 1 and method 2 may be selected as needed, and is not restricted in the present disclosure.

It should be noted that the heights of the substrates etched away by the methods shown in FIG. 1 to FIG. 3, such as h1, h2, and h3, are different, so as to meet the different needs of users. Further, in a specific example, the height of the substrate etched away after the etching process of the present disclosure is between about 2 nanometers and about 4 nanometers, for example, as shown in FIG. 1 or 2 or 3, the height is between about 2 nanometers and about 4 nanometers, for example, about 2 nanometers, or about 3 nanometers, or about 3.2 nanometers, or about 4 nanometers, etc. Thus, compared with the prior art, the present disclosure reduces the height of over-etching, improves the degree of refinement, and lays a foundation for achieving miniaturization.

In this way, by modulating the volume ratio of carbon and fluorine in the etching gas, the growth rate of the polymer layer on the top and bottom of the spacer layer can be modulated, and the etching rate of the top and bottom of the spacer layer can be modulated indirectly, to optimize the time difference between opening the top and bottom of the oxide spacer layer.

In a specific example, the composition modulation gas may not contain hydrogen. In this case, y in the general chemical formula $C_xH_yF_z$ is equal to 0. Alternatively, in another specific example, the composition modulation gas contains hydrogen element. In this case, y in the general chemical formula $CxHyFz$ is not equal to zero.

In a specific example, the process gas also contains an inert gas, such as argon (Ar), to enhance the ion bombardment capability during the etching process. Alternatively, in another specific example, the process gas contains not only an inert gas, such as argon (Ar), but also oxygen. Here, oxygen can control the etching selection ratio between the oxide and the substrate, such as a silicon substrate.

In a specific example, the volume ratio of each component in the process gas is as follows:

the etching gas: about 10% to about 30%, for example, in some examples, the etching gas accounts for about 10%, or about 30%, or about 15%, or about 20%, etc, and the specific proportion is not restricted specifically in the present disclosure;

the composition modulation gas: about 5% to about 25%, for example, in some examples, the composition modulation gas accounts for about 5%, or about 25%, or about 15%, or about 20%, etc., and the specific proportion is not restricted specifically in the present disclosure;

the oxygen: about 3%-about 10%, for example, in some examples, oxygen accounts for about 3%, or about 10%, or about 5%, or about 7%, etc., and the specific proportion is not restricted specifically in the present disclosure;

the inert gas: about 50%-about 80%, for example, in some examples, the inert gas accounts for about 50%, or about 80%, or about 60%, or about 70%, etc., and the specific proportion is not restricted specifically in the present disclosure.

In a specific example, the processing parameters of the chamber include one or more of:

a pressure in a range of about 5 mTorr to about 70 mTorr, for example, in some examples, the pressure is 5 mTorr, or 70 mTorr, or 15 mTorr, or 30 mTorr, or 50 mtorr, and is not restricted specifically in the present disclosure and can be modulated based on actual needs;

a source power in a range of about 100 watts to about 500 watts, for example, in some examples, the source power is about 100 watts; or about 500 watts, or about 200 watts, or about 300 watts, or about 450 watts, and is not restricted specifically in the present disclosure and can be modulated based on actual needs;

a center power in the range of about 50 watts to about 200 watts, for example, in some examples, the source power is about 50 watts; or about 200 watts, or about 100 watts, or about 80 watts, or about 150 watts, and is not restricted specifically in the present disclosure and can be modulated based on actual needs;

a bias power in the range of about 100 watts to about 500 watts, for example, in some examples, the source power is about 100 watts; or about 500 watts, or about 200 watts, or about 300 watts, or about 450 watts, and is not restricted specifically in the present disclosure and can be modulated based on actual needs.

It should be noted that the above-mentioned source power and center power are the power required to generate plasma, and in practical applications, they can also be collectively referred to as power, and is not restricted specifically in the present disclosure.

In another specific example, the processing parameters of the chamber further include one or more of:

$C_4F_8$: about 30 standard cubic centimeters per minute to about 80 standard cubic centimeters per minute; for example, in some examples, the $C_4F_8$ is provided at about 30 standard cubic centimeters per minute; or about 80 standard cubic centimeters per minute, or about 40 standard cubic centimeters per minute, or about 50 standard cubic centimeters per minute, or about 75 standard cubic centimeters per minute, and is not restricted specifically in the present disclosure and can be modulated based on actual needs.

$O_2$: about 10 standard cubic centimeters per minute to about 30 standard cubic centimeters per minute; for example, in some examples, $O_2$ is provided at about 30 standard cubic centimeters per minute; or about 10 standard cubic centimeters per minute, or about 15 standard cubic centimeters per minute, or about 20 standard cubic centimeters per minute, or about 25 standard cubic centimeters per minute, and is not restricted specifically in the present disclosure and can be modulated based on actual needs.

Ar: about 200 standard cubic centimeters per minute to about 500 standard cubic centimeters per minute; for example, in some examples, the Ar provided at about 200 standard cubic centimeters per minute; or about 500 standard cubic centimeters per minute, or about 300 standard cubic centimeters per minute, or about 350 standard cubic centimeters per minute, or about 450 standard cubic centimeters per minute, and is not restricted specifically in the present disclosure and can be modulated based on actual needs.

Composition modulation gas: about 30 standard cubic centimeters per minute to about 80 standard cubic centimeters per minute; for example, in some examples, the composition modulation gas is provided at about 30 standard cubic centimeters per minute; or about 80 standard cubic centimeters per minute, or about 50 standard cubic centimeters per minute, or about 60 standard cubic centimeters per minute, or about 65 standard cubic centimeters per minute, and is not restricted specifically in the present disclosure and can be modulated based on actual needs.

Temperature: about 20° C. to about 50° C.; for example, in some examples, the temperature is about 20° C.; or about 50° C.; or about 30° C.; or about 45° C., and is not restricted specifically in the present disclosure and can be modulated based on actual needs.

It should be noted that in the present disclosure, the use of the term "about" in combination with a numerical value is intended to be within ten percent (10%) of the indicated value.

In this way, in the present disclosure, a composition adjustment gas is added to the process gas, and used to modulate the etching conditions of different positions of a same film layer, thereby minimizing the over-etching time and minimizing the loss caused by the over-etching of the underlying substrate, thereby increasing the yield and finished product ratio.

The present disclosure also provides a plasma processing apparatus. The plasma processing apparatus includes a plasma chamber having an interior operable to receive a process gas. The plasma processing apparatus includes a processing chamber having a workpiece support operable to support a workpiece. The workpiece includes a spacer layer, and a bias electrode is disposed in the workpiece support. The plasma processing apparatus includes a gas delivery system operable to flow a composition modulation gas, the composition modulation gas modulates a volume ratio of carbon and fluorine to process the workpiece, the composition modulation gas includes one or more molecules having a chemical formula $C_xH_yF_z$, where x and z are natural numbers greater than zero, and y is a natural number greater than or equal to zero, the volume ratio of carbon and fluorine is indicative of a distribution of carbon-based polymer deposited on the spacer layer. The plasma processing apparatus includes an inductive element operable to induce a plasma in the plasma chamber. The plasma processing apparatus includes a bias source configured to provide DC power and RF power to the bias electrode. The plasma processing apparatus further includes a controller configured to control the gas delivery system, the inductive element, and the bias source to implement an etching process, the etching process including operations. The operations include admitting the composition modulation gas in the plasma chamber. The operations include admitting an etching gas in the plasma chamber. The operations include providing RF power to the inductive element to generate a first plasma from the process gas to generate a first mixture, the first mixture including one or more first species, the process gas includes the composition modulation gas and the etching gas. The operations further include providing RF power to the bias electrode to generate a second plasma in the first mixture in the processing chamber to generate a second mixture, the second mixture including one or more second species. In a specific example, the controller is further configured to control the bias electrode, so that it is convenient to provide RF power to the bias electrode.

It should be noted that the present disclosure can use any plasma source, for example, an inductively coupled plasma source, a capacitively coupled plasma source, etc., which is not restricted specifically.

In a specific example, the plasma chamber and the processing chamber are the same chamber.

In a specific example, the processing parameters of the processing chamber include one or more of:
  a pressure in a range of about 5 mTorr to about 70 mTorr, for example, in some examples, the pressure is 5 mTorr, or 70 mTorr, or 15 mTorr, or 30 mTorr, or 50 mtorr, and is not restricted specifically in the present disclosure and can be modulated based on actual needs;
  a source power in a range of about 100 watts to about 500 watts, for example, in some examples, the source power is about 100 watts; or about 500 watts, or about 200 watts, or about 300 watts, or about 450 watts, and is not restricted specifically in the present disclosure and can be modulated based on actual needs;
  a center power in the range of about 50 watts to about 200 watts, for example, in some examples, the source power is about 50 watts; or about 200 watts, or about 100 watts, or about 80 watts, or about 150 watts, and is not restricted specifically in the present disclosure and can be modulated based on actual needs;
  a bias power in the range of about 100 watts to about 500 watts, for example, in some examples, the source power is about 100 watts; or about 500 watts, or about 200 watts, or about 300 watts, or about 450 watts, and is not restricted specifically in the present disclosure and can be modulated based on actual needs.

It should be noted that the above-mentioned source power and center power are the power required to generate plasma, and in practical applications, they can also be collectively referred to as power, and is not restricted specifically in the present disclosure.

It should be noted that in the present disclosure, the use of the term "about" in combination with a numerical value is intended to be within ten percent (10%) of the indicated value.

In addition, it should be noted that the above-mentioned source power and center power are the power required to generate plasma, and in practical applications, they can also be collectively referred to as power, and is not restricted specifically in the present disclosure.

In a specific example of the present disclosure, a first portion of the polymer layer is formed on a first region of the spacer layer, and a second portion of the polymer layer is formed on a second region of the spacer layer, the first region is higher than the second region, and a first thickness of the first portion is different from a second thickness of the second portion.

In a specific example of the present disclosure, the admitted composition modulation gas produces a first volume ratio of carbon and fluorine that is greater than or equal to a preset ratio, such that the first thickness is greater than the second thickness; or the admitted composition modulation gas produces a second volume ratio of carbon and fluorine that is less than the first preset ratio, such that the first thickness is less than the second thickness.

In a specific example of the present disclosure, the spacer layer is an oxide spacer layer.

In a specific example of the present disclosure, the etching gas includes Octafluorocyclobutane ($C_4F_8$).

In a specific example of the present disclosure, the composition modulation gas includes one or more of Difluoromethane ($CH_2F_2$), Fluoroform ($CHF_3$), and Carbon tetrafluoride ($CF_4$).

In a specific example of the present disclosure, the process gas further includes an inert gas; or, the process gas further includes an inert gas and oxygen. In a specific example of the present disclosure, a volume proportion of each component in the process gas is as follows: the etching gas of about 10%-about 30%; the composition modulating gas of about 5% to about 25%; the oxygen of about 3% to about 10%; and the inert gas of about 50% to about 80%.

Some embodiments of the present disclosure may be implemented as apparatuses corresponding to the above method embodiments, and will not be repeated here.

Figure 5:
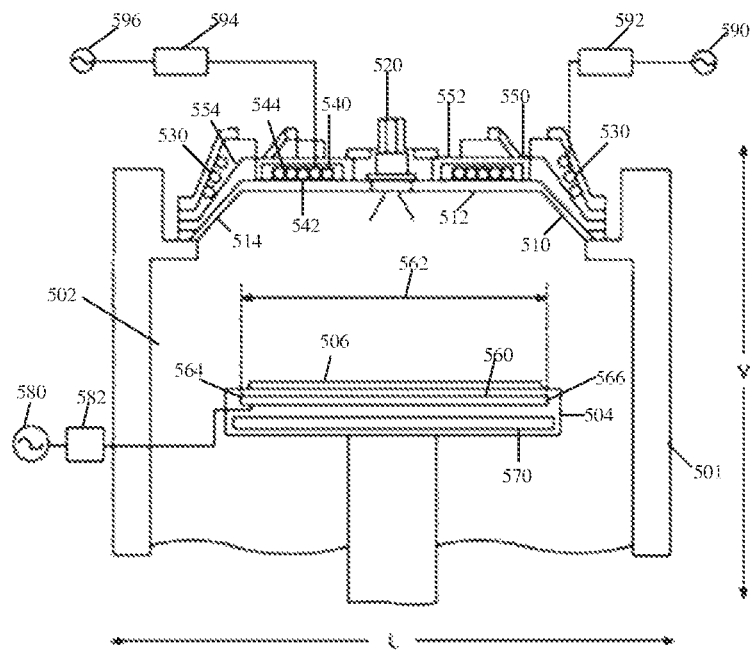
FIG. 5 is a cross-sectional view of a plasma processing apparatus in a specific example according to an embodiment of the present disclosure.

In a specific example, as shown in FIG. 5, the plasma processing apparatus may include a processing chamber 501 defining a vertical direction V and a lateral direction L.

The plasma processing apparatus may include a pedestal (that is, a workpiece support) 504 provided in the internal space 502 of the processing chamber 501. The pedestal 504 may be configured to, in the internal space 502, support the substrate or the workpiece 506 to be etched. A dielectric window 510 is located above the pedestal 504 and serves as the top plate of the internal space 502. The dielectric window 510 includes a central portion 512 and an angled peripheral portion 514. The dielectric window 510 includes a space for the shower head 520 in the central portion 512 to inject a processing gas, such as an etching gas, into the inner space 502.

In some embodiments, the plasma processing apparatus may include a plurality of inductive elements, such as a primary inductive element 530 and a secondary inductive element 540, for generating induced plasma in the internal space 502. The primary inductive element 530 and the secondary inductive element 540 may each include a coil or an antenna element, and may induce plasma in the processing gas in the internal space 502 of the processing chamber 501 when supplied with RF power. For example, a first RF generator 590 may be configured to provide electromagnetic energy to the primary inductive element 530 through a matching network 592. A second RF generator 596 may be configured to provide electromagnetic energy to the secondary inductive element 540 through a matching network 594.

Although terms such as primary inductive element and secondary inductive element are used in the present disclosure, it should be noted that the terms "primary" and "secondary" are used for convenience only and are not used to limit the present disclosure. Moreover, in practical applications, the secondary coil can be operated independently of the primary coil, and the primary coil can be operated independently of the secondary coil. In addition, in some embodiments, the plasma processing apparatus may only have a single inductive coupling element.

In some embodiments, the plasma processing apparatus may include a metal shield 552 disposed around the secondary inductive element 540. In this way, the metal shield 552 separates the primary inductive element 530 and the secondary inductive element 540 to reduce the crosstalk between the primary inductive element 530 and the secondary inductive element 540.

In some embodiments, the plasma processing apparatus may include a first Faraday shield 554 disposed between the primary inductive element 530 and the dielectric window 510. The first Faraday shield 554 may be a slotted metal shield that reduces the capacitive coupling between the primary inductive element 530 and the processing chamber 501. As shown in FIG. 5, the first Faraday shield 554 may be fitted over the angled portion of the dielectric window 510.

In some embodiments, the metal shield 552 and the first Faraday shield 554 may form a single body 550 for ease of manufacturing or other purposes. The multi-turn coil of the primary inductive element 530 may be located adjacent to the first Faraday shield 554 of the single body 550. The secondary inductive element 540 may be located close to the metal shield 552 of the single body 550, for example, between the metal shield 552 and the dielectric window 510.

The arrangement of the primary inductive element 530 and the secondary inductive element 540 on opposite sides of the metal shield 552 allows the primary inductive element 530 and the secondary inductive element 540 to have different structural configurations and perform different functions. For example, the primary inductive element 530 may include a multi-turn coil located near the peripheral portion of the processing chamber 501. The primary induction element 530 can be used for basic plasma generation and reliable startup during the inherent transient ignition phase. The primary inductive element 530 may be coupled to a powerful RF generator and an expensive auto-tuning matching network, and may be operated at an increased RF frequency (e.g., about 13.56 MHz).

In some embodiments, the secondary inductive element 540 may be used for correction and auxiliary functions as well as for improving the stability of the plasma during steady state operation. In addition, since the secondary inductive element 540 may be mainly used for correction and auxiliary functions and to improve plasma stability during steady-state operation, the secondary inductive element 540 does not have to be coupled to a powerful RF generator like the primary inductive element 530. Therefore, different and cost-effective designs can be made to overcome the difficulties associated with previous designs. As discussed in detail below, the secondary inductive element 540 may also be operated at a lower frequency (for example, about 2 MHz), allowing the secondary inductive element 540 to be very compact and fit in a limited space on top of the dielectric window.

In some embodiments, the primary inductive element 530 and the secondary inductive element 540 may be operated at different frequencies. The frequency may be sufficiently different to reduce crosstalk in the plasma between the primary inductive element 530 and the secondary inductive element 540. For example, the frequency applied to the primary inductive element 530 may be at least about 1.5 times the frequency applied to the secondary inductive element 530. In some embodiments, the frequency applied to the primary inductive element 530 may be about 13.56 MHz, and the frequency applied to the secondary inductive element 540 may be in the range of about 1.75 MHz to about 2.15 MHz. Other suitable frequencies can also be used, such as about 400 kHz, about 4 MHz, and about 27 MHz. Although the present disclosure is discussed with reference to the primary inductive element 530 operating at a higher frequency relative to the secondary inductive element 540, those skilled in the art using the disclosure provided herein should understand that the secondary inductive element 540 can be operated at a higher frequency without departing from the scope of the present disclosure.

In some embodiments, the secondary inductive element 540 may include a planar coil 542 and a magnetic flux concentrator 544. The magnetic flux concentrator 544 may be made of ferrite material. Using a magnetic flux concentrator with an appropriate coil can enable the secondary inductive element 540 to have higher plasma coupling and good energy transmission efficiency, and can significantly reduce its coupling with the metal shield 552. Using a lower frequency (for example, about 2 MHz) on the secondary induction element 540 can increase the skin layer, which also improves the plasma heating efficiency.

In some embodiments, the primary inductive element 530 and the secondary inductive element 540 may have different functions. For example, the primary inductive element 530 may be used to perform the basic function of plasma generation during ignition and provide sufficient priming for the secondary inductive element 540. The primary inductive element 530 may have couplings to both the plasma and the ground shield to stabilize the plasma potential. The first Faraday shield 554 associated with the primary inductive element 530 avoids window sputtering and may be used to provide coupling to the ground shield.

An additional coil may be operated in the presence of a good plasma priming provided by the primary induction element 530, and therefore, the additional coil preferably has good plasma coupling to the plasma and good energy transfer efficiency. The secondary inductive element 540 including the magnetic flux concentrator 544 not only provides good magnetic flux transfer to the plasma volume, but also provides good decoupling between the secondary inductive element 540 and the surrounding metal shield 552. The symmetrical driving of the magnetic flux concentrator 544 and the secondary inductive element 540 further reduces the voltage amplitude between the coil end and the surrounding ground element. This can reduce the sputtering of the dome, but at the same time it will bring some small capacitive coupling to the plasma, which can be used to aid ignition. In some embodiments, a second Faraday shield can be used in combination with the secondary inductive element 540 to reduce the capacitive coupling of the secondary inductive element 540.

In some embodiments, the plasma processing apparatus may include a radio frequency (RF) bias electrode 560 disposed in the processing chamber 501. The plasma processing apparatus may further include a ground plane 570 disposed in the processing chamber 501 such that the ground plane 570 is spaced apart from the RF bias electrode 560 along the vertical direction V. As shown in FIG. 5, in some embodiments, the RF bias electrode 560 and the ground plane 570 may be disposed in the base 504.

In some embodiments, the RF bias electrode 560 may be coupled to the RF power generator 580 via a suitable matching network 582. When the RF power generator 580 provides RF energy to the RF bias electrode 560, plasma may be generated from the mixture in the processing chamber 501 to be directly exposed to the substrate 506. In some embodiments, the RF bias electrode 560 may define an RF region 562 extending along the lateral direction L between the first end 564 of the RF bias electrode 560 and the second end 566 of the RF bias electrode 560. For example, in some embodiments, the RF region 562 may span from the first end 564 of the RF bias electrode 560 to the second end 566 of the RF bias electrode 560 along the lateral direction L. The RF region 562 may further extend along the vertical direction V between the RF bias electrode 560 and the dielectric window 510.

It should be understood that the length of the ground plane 570 along the lateral direction L is greater than the length of the RF bias electrode 560 along the lateral direction L. In this way, the ground plane 570 can direct the RF energy emitted by the RF bias electrode 560 to the substrate 506.

It should be noted that in the present disclosure, the use of the term "about" in combination with a numerical value is intended to be within ten percent (10%) of the indicated value.

Here, the structure shown in FIG. 5 is only exemplary. In practical applications, the plasma processing apparatus may also include other functional components based on actual requirements, and is not restricted specifically in the present disclosure.

For example, in a specific example, based on the mattson paradigmE XP2 platform, an inductively coupled plasma chamber (that is, a processing chamber) equipped with a Faraday shield is used to complete the etching process. Specifically, to the mixed gas containing $C_4F_8$, $O_2$, and Ar, different CHF-type gases (that is, gases including the three elements of C, H, and F), that is, one or more gases having a chemical formula $C_xH_yF_z$, for example, $CH_2F_2$, or $CHF_3$ or $CF_4$ gas is added to achieve etching of the top and bottom silicon oxide layers in the silicon oxide spacer layer. For example, as shown in FIG. 1, $CH_2F_2$ gas is added to cause more carbon-based polymer to be deposited on the top and slow down the etching rate on the top. For another example, as shown in FIG. 2, $CHF_3$ or $CF_4$ is added to make the carbon-based polymer deposit more on the bottom and slow down the etching rate on the bottom. In this way, by adding CHF gas to modulate the element ratio, the silicon oxide on the top and bottom of the silicon oxide spacer layer can be opened at the same time, thereby reducing the over-etching time of the substrate silicon and reducing the excessive loss of the substrate silicon The present disclosure also provides a semiconductor device including a workpiece processed by a method as described above, the workpiece includes a substrate and the spacer layer formed on the substrate, a height of the substrate etched away in the workpiece obtained is in a range of about 2 nanometers (nm) to about 4 nm, for example, about 2 nanometers, or about 3 nanometers, or about 3.2 nanometers, or about 4 nanometers, etc. Compared with the prior art, the present disclosure reduces the height of over-etching, improves the degree of refinement, and lays a foundation for achieving miniaturization.

In an example, the semiconductor device may specifically be a logic processor, a memory, and/or the like.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged in whole or in part. Furthermore, those of ordinary skill in the art will appreciate that the foregoing description is by way of example only and is not intended to limit the invention so further described in such appended claims.

What is claimed is:

1. A method for processing a workpiece, comprising:
placing the workpiece on a workpiece support in a chamber, wherein the workpiece comprises a spacer layer;
selecting a composition modulation gas to modulate a volume ratio of carbon and fluorine to process the workpiece, wherein the composition modulation gas comprises one or more molecules having a chemical formula $C_xH_yF_z$, where x and z are natural numbers greater than zero, and y is a natural number greater than or equal to zero, wherein the volume ratio of carbon and fluorine is indicative of a distribution of carbon-based polymer deposited on the spacer layer;
generating one or more species using one or more plasmas from a process gas to create a mixture, wherein the process gas comprises an etching gas and the composition modulation gas; and
exposing the workpiece to the mixture to form a polymer layer on at least a portion of the spacer layer and to etch at least a portion of the spacer layer of the workpiece, wherein:
a first portion of the polymer layer is formed on a first region of the spacer layer, and a second portion of the polymer layer is formed on a second region of the spacer layer; and
the first region is higher than the second region, and a first thickness of the first portion is different from a second thickness of the second portion.

2. The method of claim 1, wherein selecting the composition modulation gas comprises:
selecting the composition modulation gas to produce a first volume ratio of carbon and fluorine that is greater than or equal to a preset ratio, such that the first thickness is greater than the second thickness; or
selecting the composition modulation gas to produce a second volume ratio of carbon and fluorine that is less than the preset ratio, such that the first thickness is less than the second thickness.

3. The method of claim 1, wherein the spacer layer is an oxide spacer layer.

4. The method of claim 1, wherein the etching gas comprises Octafluorocyclobutane ($C_4F_8$).

5. A method for processing a workpiece, comprising:
placing the workpiece on a workpiece support in a chamber, wherein the workpiece comprises a spacer layer;
selecting a composition modulation gas to modulate a volume ratio of carbon and fluorine to process the workpiece, wherein the composition modulation gas comprises:
one or more molecules having a chemical formula $C_xH_yF_z$, where x and z are natural numbers greater than zero, and y is a natural number greater than or equal to zero, wherein the volume ratio of carbon and fluorine is indicative of a distribution of carbon-based polymer deposited on the spacer layer; and
one or more of Difluoromethane ($CH_2F_2$), Fluoroforni ($CHF_3$), and Carbon tetrafluoride ($CF_4$);
generating one or more species using one or more plasmas from a process gas to create a mixture, wherein the process gas comprises:
an etching gas and the composition modulation gas; and
an inert gas; or, the process gas further comprises an inert gas and oxygen;
exposing the workpiece to the mixture to form a polymer layer on at least a portion of the spacer layer and to etch at least a portion of the spacer layer of the workpiece, wherein a volume proportion of each component in the process gas is as follows:
the etching gas: about 10%-about 30%;
the composition modulation gas: about 5%-about 25%;
the oxygen: about 3%-about 10%; and
the inert gas: about 50%-about 80%.

6. A method for processing a workpiece, comprising:
placing the workpiece on a workpiece support in a chamber, wherein the workpiece comprises a spacer layer;
selecting a composition modulation gas to modulate a volume ratio of carbon and fluorine to process the workpiece, wherein the composition modulation gas comprises one or more molecules having a chemical formula $C_xH_yF_z$ where x and z are natural numbers greater than zero, and y is a natural number greater than or equal to zero, wherein the volume ratio of carbon and fluorine is indicative of a distribution of carbon-based polymer deposited on the spacer layer;
generating one or more species using one or more plasmas from a process gas to create a mixture, wherein the process gas comprises an etching has and the composition modulation gas; and
exposing the workpiece to the mixture to form a polymer layer on at least a portion of the spacer layer and to etch at least a portion of the spacer layer of the workpiece, wherein a processing parameter of the chamber comprises one or more of:
a pressure: about 5 mTorr-about 70 mTorr;
a source power: about 100 watts-about 500 watts;
a center power: about 50 watts-about 200 watts; and
a bias power: about 100 watts-about 500 watts.

7. A method for processing a workpiece, comprising:
placing the workpiece on a workpiece support in a chamber, wherein the workpiece comprises a spacer layer;
selecting a composition modulation gas to modulate a volume ratio of carbon and fluorine to process the workpiece, wherein the composition modulation gas comprises one or more molecules having a chemical formula $C_xH_yF_z$, where x and z are natural numbers greater than zero and y is a natural number greater than or equal to zero, wherein the volume ratio of carbon and fluorine is indicative of a distribution of carbon-based polymer deposited on the spacer layer;
generating one or more species using one or more plasmas from a process gas to create a mixture, wherein the process gas comprises an etching gas and the composition modulation gas; and
exposing the workpiece to the mixture to form a polymer layer on at least a portion of the spacer layer and to etch at least a portion of the spacer layer of the workpiece wherein generating the one or more species further comprises:
providing a first radio frequency (RF) power to an induction coil to generate a first plasma from the process gas to generate a first mixture in the chamber, the first mixture comprising one or more first species; and
providing a second RF power to a bias electrode to generate a second plasma in the first mixture in the chamber to generate a second mixture, the second mixture comprising one or more second species, wherein exposing the workpiece to the mixture comprises exposing the workpiece to the second mixture.

* * * * *